United States Patent [19]

Long et al.

[11] Patent Number: 4,800,419
[45] Date of Patent: Jan. 24, 1989

[54] SUPPORT ASSEMBLY FOR INTEGRATED CIRCUITS

[75] Inventors: Jon Long, Livermore; V. K. Sahakian, Los Altos Hills, both of Calif.

[73] Assignee: LSI Logic Corporation, Santa Clara, Calif.

[21] Appl. No.: 8,208

[22] Filed: Jan. 28, 1987

[51] Int. Cl.⁴ ............... H01L 23/48; H01L 23/28
[52] U.S. Cl. ............................ 357/70; 357/69; 357/72
[58] Field of Search ................ 357/70, 69, 72

[56] References Cited

U.S. PATENT DOCUMENTS

| | | |
|---|---|---|
| 3,793,714 | 2/1974 | Bylander . |
| 3,967,366 | 7/1976 | Birglechner et al. ............ 357/70 |
| 4,079,511 | 3/1978 | Grabbe . |
| 4,234,666 | 11/1980 | Gursky ............................ 357/70 |
| 4,301,464 | 11/1981 | Otsuki et al. .................... 357/70 |
| 4,308,339 | 12/1981 | Lindberg ........................ 357/70 |
| 4,380,042 | 4/1983 | Angelucci, Sr. et al. . |
| 4,390,042 | 6/1983 | Phy . |
| 4,477,827 | 10/1984 | Walker et al. .................. 357/70 |
| 4,538,210 | 8/1985 | Schaller ........................... 357/70 |
| 4,661,837 | 4/1987 | Sono ............................... 357/70 |

FOREIGN PATENT DOCUMENTS

| | | | |
|---|---|---|---|
| 56-91455 | 7/1981 | Japan ............................. | 357/70 |
| 57-107064 | 7/1982 | Japan ............................. | 357/70 |

*Primary Examiner*—William L. Sikes
*Assistant Examiner*—Gregory Key
*Attorney, Agent, or Firm*—Nathan N. Kallman; Alan H. MacPherson; Paul J. Winters

[57] ABSTRACT

A composite support assembly for an integrated circuit chip includes a rigid lead frame that is attached to a relatively thin flexible tape-like structure. The tape-like structure is etched with inner lead fingers and outer lead fingers to allow a short pitch, high density arrangement of the lead fingers, thereby enabling bond wires that connect an IC chip to the support assembly to be shortened. As a result, a significant increase in the number of leads is realized, using a standard size IC package.

4 Claims, 4 Drawing Sheets

SUPPORT ASSEMBLY FOR INTEGRATED CIRCUITS

BACKGROUND OF THE INVENTION

1. Field of the Invention

This invention relates to an integrated circuit package and in particular to a support assembly for integrated circuit chips.

2. Description of the Prior Art

Integrated circuits (IC) generally comprise a number of gates or flip-flops that are packaged in a single IC container. The IC package provides input and output pins, pads, or leads which are connected to plated strips on circuit boards or other means to form a complete circuit of which the IC is a part. The IC chips are packaged by die attachment to paddles of lead frames. The lead frames are either stamped or etched according to the quantity to be made. In the event that a large quantity is to be produced, then stamping techniques are employed. On the other hand, if only a small quantity of frames are needed, then they may be made by slower photolithography and etching techniques. The etching techniques allow finer tolerances than the stamping method. After die attachment, the bond pads of the device are connected to the leads of the lead frame by means of a fine metallic wire. Upon completion of the chip to frame interconnection, the chip and interconnections are encompassed by the IC package.

One problem that is encountered with stamped frames is the limitation of the space between the leads and components of the IC assembly imposed by the thickness of the metallic frame. The acceptable space between leads is approximately 1.5 times the thickness of the metal, which generally is a copper sheet of about 0.008 inches thick, for example.

Therefore, the spacing between leads that is required is at least 0.012 inches. If 25 leads, by way of example, are to be provided, then a total spacing of 0.300 inches is needed. This spacing creates too large a distance between the IC device, which is located centrally on the frame, and the leads at the periphery of the frame. Therefore a lower yield in production is obtained due to excessive length of the interconnecting wires. Also, the extra length required does not allow for a compact assembly with dimensions that are required by IC technology. The problem is compounded when the number of leads is increased thus necessitating a significant increase in space of the IC and the frame leads.

On the other hand, if a relatively thin tape-like support is used, such as an 0.001 inch thick metallic sheet, the spacing requirement is substantially reduced so that the leads can be located close to the IC device. However, such thin metal tapes of this type are too flexible and are not rigid enough for assembly.

SUMMARY OF THE INVENTION

An object of this invention is to provide an improved support assembly (lead frame) for integrated circuit chips.

Another object of the invention is to provide a composite IC support which provides a needed rigidity, and realizes proper alignment of the IC device and conductive leads Another object is to provide a support assembly for an IC package that achieves high density of the conductive bond locations of the IC device and a high pin count.

According to this invention, an IC package includes a composite support assembly formed with a rigid lead frame and a thin flexible tape-like structure. The tape-like structure is configured, preferably by etching, with inner bonding fingers, and with outer lead fingers that connect to the inner lead fingers. The lead fingers on the tape-like structure are disposed in a short pitch, high density pattern that can be formed as a result of the very thin structure of the flexible tape material. The lead frame is formed with leads that connect to the outer lead fingers of the tape-like structure and external circuitry. The composite support assembly allows the wire lengths connecting the IC chip to be shortened. As a result, the support assembly can be made with a greater number of leads and a higher pin count employing a standard size frame. Fine line definition of the high density lead fingers is realized with resultant improved accuracy and proper alignment of the tape-like structure on the lead frame.

BRIEF DESCRIPTION OF THE DRAWINGS

The invention will be described in greater detail with reference to the drawings in which.

Similar numerals refer to similar elements throughout the drawings.

DESCRIPTION OF THE PREFERRED EMBODIMENT

Figure 1:
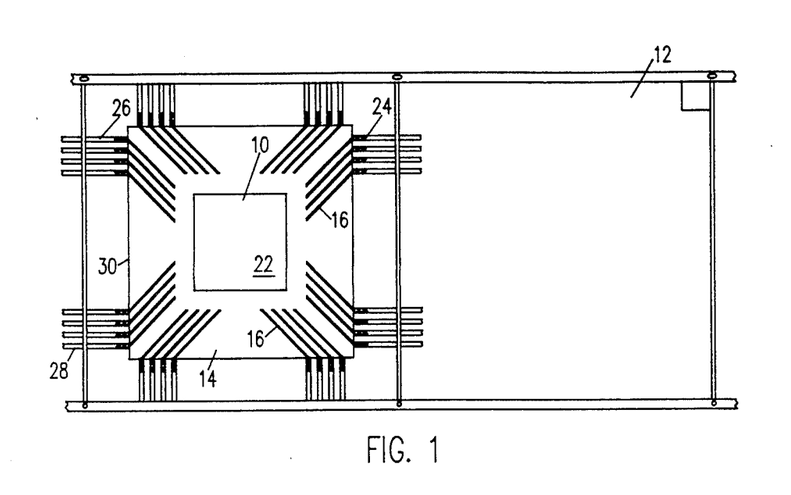
FIG. 1 is a top plan view of a support assembly for an IC chip, made in accordance with this invention.

With reference to FIG. 1, a composite support assembly (lead frame) for an IC chip 10 includes a flexible tape-like structure 14 that is joined to a rigid lead frame 12. The tape-like structure, which is preferably made of a thin copper sheet of about 0.001 inch in thickness and a dielectric film 30 of about 0.003 inch in thickness, is configured by well known photolithography and etching processes. The lead frame is preferably made as an integral piece that has been mass produced by stamping. The lead frame is formed from a rigid copper plate, about 0.008 inch in thickness.

Figure 2:
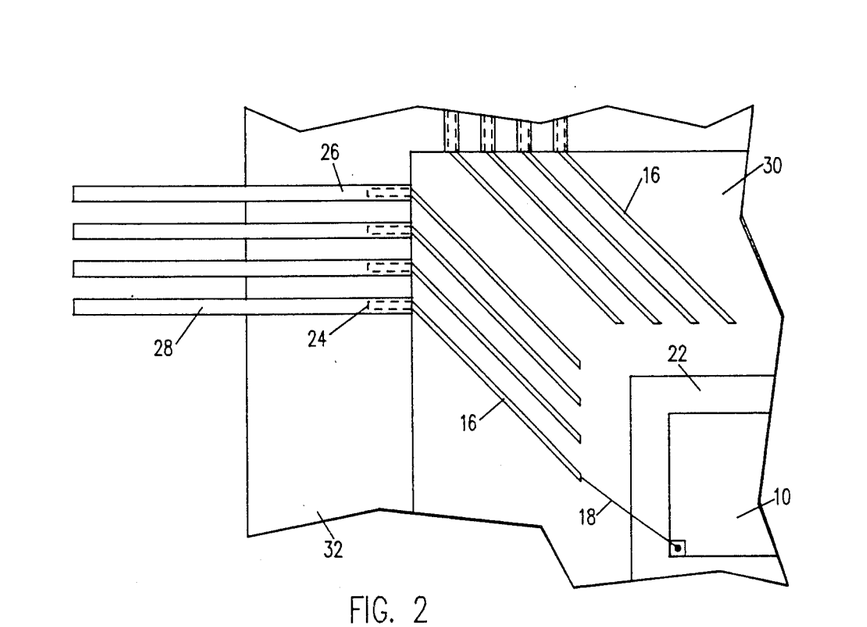
FIG. 2 is an enlarged sectional view of a portion of the assembly of FIG. 1 including the IC chip and package.
Figure 3:
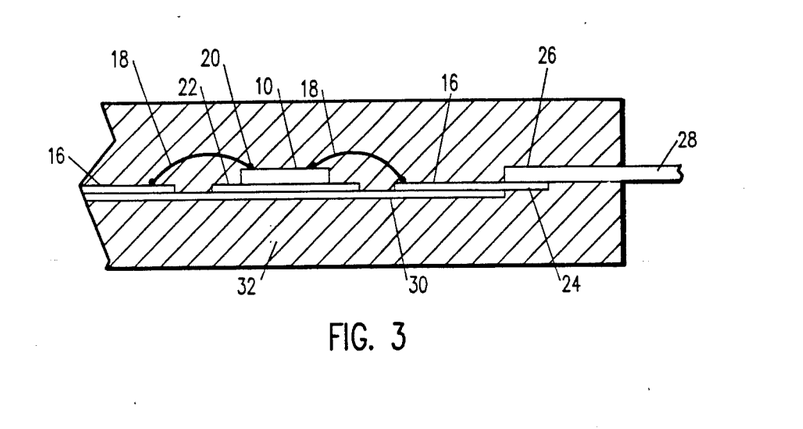
FIG. 3 is a side sectional view of a support assembly for an IC chip incorporating the flexible tape-like structure and rigid lead frame assembly of this invention with the IC chip and package.

As illustrated in FIGS. 2 and 3, the thin tape-like structure 14 is configured with inner lead fingers 16 that are electrically connected by bond wires 18 to bond pads 20 formed on an exposed surface of the IC chip 10. opposing surface of the IC chip is attached to the tape-like structure 14 through a die attach pad 22. The tape-like structure 14 is formed with outer lead fingers 24 that extend from the inner lead fingers 16 to make contact with coupling lead bonds 26, thereby providing a continuous conductive path from the integrated circuit to external package leads 28. The assembly including the structure 14 and frame 12 is housed in a package or module 32. As a result of the constricted geometry and the necessity for closely spaced patterned elements, including the lead fingers, manufacture of an IC package 32 with a relatively large number of lead fingers would be extremely difficult when employing conventional IC packaged designs. The use of a thin tape-like structure to enable the shaping of the closely spaced lead fingers with fine definition, in combination with the lead frame 12 to provide rigidity, overcomes the difficulties encountered in the prior art. Etching of a thin structure to obtain a desired pattern affords finer tolerances and better line delineation, which allows a short pitch, high density arrangement of the etched elements, including the conductive lead fingers.

Figure 4A:
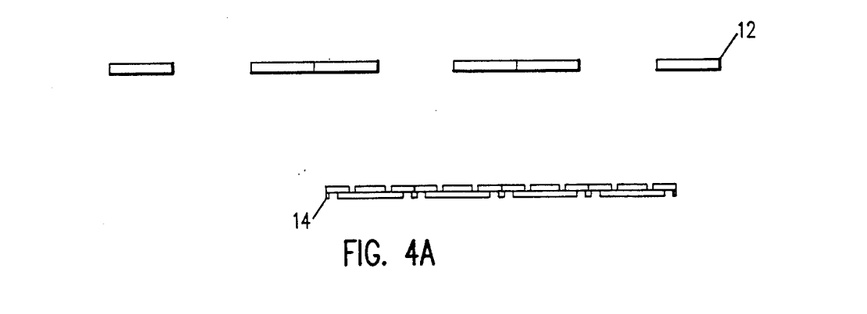
FIGS. 4A–4H illustrate the process steps of assembling the composite IC assembly.
Figure 4B:
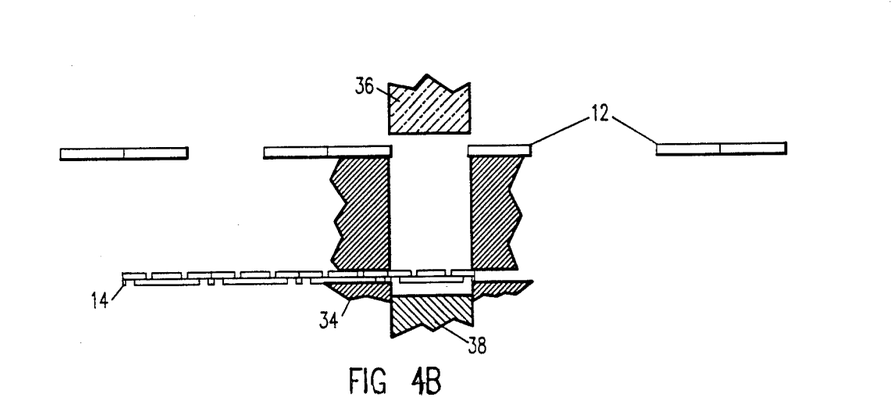
Figure 4C:
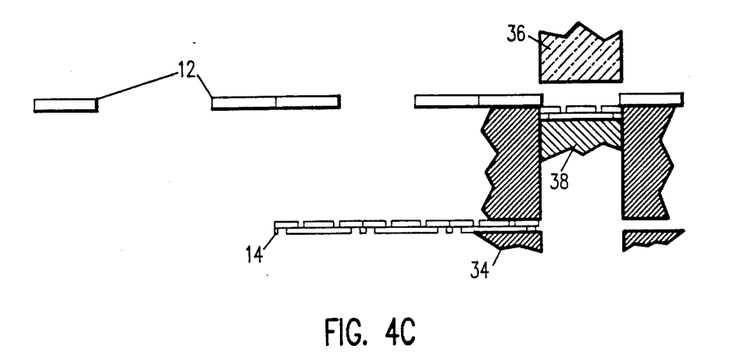
Figure 4D:
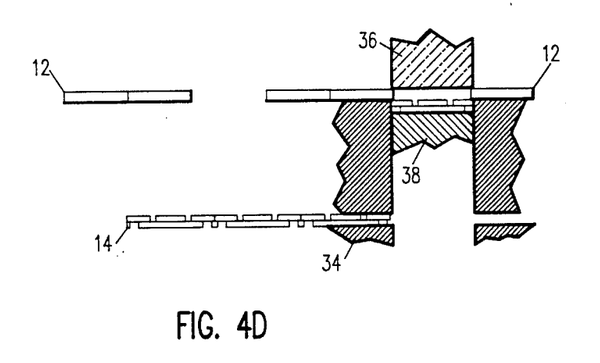
Figure 4E:
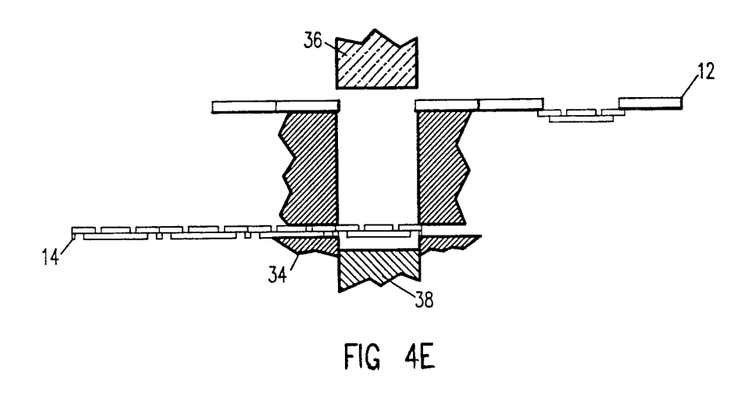

During production, the flexible tape-like structure 14 and the rigid lead frame 12 are positioned in a bonder apparatus comprising a stripper 34, a thermode 36 and a punch 38 (FIGS. 4A, 4B). The outer lead fingers 24 of the tape-like structure are aligned with respective coupling lead bonds 26. The punch separates a tape unit 14A from the tape strip, and the tape unit is moved into contact with the frame 12 (FIG. 4C). The tape unit is welded to the frame by the application of heat from the thermode, i.e. thermocompression bonding or eutectic bonding. The thermode and the punch are then returned to the home position, and the assembly of the lead frame with the tape unit is advanced, enabling repetition of the assembly process (FIG. 4E).

Figure 4F:
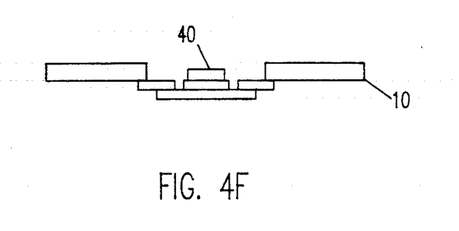
Figure 4G:
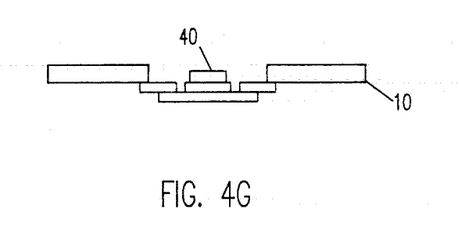
Figure 4H:
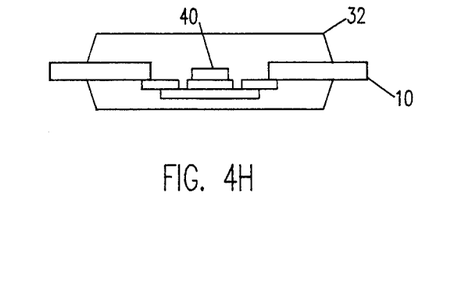

An IC device 10 is then mounted on the composite frame and tape unit assembly 40 (FIG. 4F), and the IC device is wire bonded to the composite frame (FIG. 4G). Finally, the assembly of the bonded device and the frame 12 is encapsulated to form an IC package 32 (FIG. 4H).

The composite IC support assembly allows a high pin count with accurate definition of the connecting lead fingers. By virtue of the design of the assembly disclosed herein, production yield is significantly increased and manufacturing costs are reduced. Since the outer and inner lead fingers can be brought closer to the IC chip, the bond wires between the chip and the inner lead fingers are shortened. As a result, a relatively high number of leads can be incorporated in an IC package design. In successful implementations, packages having 68 leads and 132 leads were made employing a standard package mold. The support assembly design virtually eliminates losses of IC assemblies and production resulting from high temperature processing by mechanical forces, such as experienced in previous approaches to manufacture IC packages. It will be apparent to one skilled in the art that it is not necessary to employ the materials and thicknesses of the frame and tape-like structure given as examples herein. It is understood that various modifications may be made without departing from the spirit and scope of the instant invention.

What is claimed is:

1. A composite package assembly for supporting an integrated circuit chip comprising;
   a relatively thin flexible tape-like structure having inner lead fingers, and having outer lead fingers electrically connected to said inner lead fingers;
   a die attach pad having one surface attached to said structure;
   an integrated circuit chip attached to the other exposed surface of said die attach pad;
   a rigid lead frame joined to said structure and having internal leads aligned to and connected to said outer lead fingers;
   package leads electrically connected to said internal leads for connection to external circuitry; and
   metallic wires connecting said integrated circuit chip to said inner lead fingers.

2. A composite assembly as in claim 1, including a package encompassing said assembly.

3. A composite assembly as in claim 1, wherein said tape-like structure has a metal portion of thickness of about 0.001 inch and a dielectric film portion of thickness of about 0.003 inch and said frame has a thickness of about 0.008 inch.

4. A composite assembly as in claim 1 wherein said tape-like structure comprises an etched configuration and said frame comprises a stamped configuration.

* * * * *

UNITED STATES PATENT AND TRADEMARK OFFICE
CERTIFICATE OF CORRECTION

PATENT NO. : 4,800,419
DATED : January 24, 1989
INVENTOR(S) : Jon Long et al.

It is certified that error appears in the above-identified patent and that said Letters Patent is hereby corrected as shown below:

IN THE SPECIFICATION

At column 2, line 46, after "a thin copper sheet" please insert --16, 22--.

IN THE DRAWINGS

Please substitute the attached Figures wherein:

In Fig. 1, numeral 10 and its lead line have been deleted, the lead line of reference 12 has been moved to point to the top portion of the lead frame, and the small square region shown just below and to the right of reference numeral 12 has been deleted.

In Fig. 2, reference numeral 20 has been added pointing to the bonding pad of IC 10.

In Figs. 4A-4H, reference numerals have been added indicating the correspondence of layers 12 and 14 to the elements shown in Fig. 3.

In Figs. 4B-4E, bonding areas 26 of layer 12 have been extended inwardly towards the center of punching unit 38 as indicated in the originally filed informal drawings.

In Fig. 4B, the tape unit within the cutting jig has been labelled as tape unit 14A.

In Figs. 4F-4H, reference numerals 10 and 40 have been exchanged.

UNITED STATES PATENT AND TRADEMARK OFFICE
CERTIFICATE OF CORRECTION

PATENT NO. : 4,800,419
DATED : January 24, 1989
INVENTOR(S) : Jon Long et al.

It is certified that error appears in the above-identified patent and that said Letters Patent is hereby corrected as shown below:

In Figs. 4G and 4H, the bonding wires 18 shown in Fig. 3 have been added.

Signed and Sealed this

Thirteenth Day of November, 1990

Attest:

HARRY F. MANBECK, JR.

*Attesting Officer*          *Commissioner of Patents and Trademarks*